(12) United States Patent
Young

(10) Patent No.: US 6,281,773 B1
(45) Date of Patent: *Aug. 28, 2001

(54) MAGNETIZING MAGNET

(75) Inventor: Ian Robert Young, NR Marlborough (GB)

(73) Assignee: Picker International, Inc., Cleveland, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/356,255

(22) Filed: Jul. 16, 1999

(30) Foreign Application Priority Data

Jul. 17, 1998 (GB) .................................................. 9815540
May 11, 1999 (GB) .................................................. 9910748

(51) Int. Cl.[7] ....................................................... H01F 1/00
(52) U.S. Cl. .............................................. 335/299; 335/216
(58) Field of Search ........................... 335/216, 296–301; 324/318–321; 505/892–899

(56) References Cited

U.S. PATENT DOCUMENTS 4,935,714 * 6/1990 Vermilyea ............................ 335/299
5,138,326 * 8/1992 Edwards et al. ...................... 324/319
5,182,914 * 2/1993 Barclay et al. ....................... 505/889
5,379,018 * 1/1995 DeWames et al. .................. 335/216
5,557,155 * 9/1996 Hull ..................................... 505/166
5,563,564   10/1996 Chu et al. .
5,563,565 * 10/1996 Hull ..................................... 335/216
5,640,887 * 6/1997 Hull et al. ............................ 505/166
5,743,410 * 4/1998 Stadtmuller ......................... 335/216
5,932,096 * 8/1999 Saho et al. ........................... 505/892

FOREIGN PATENT DOCUMENTS

WO 89/03581    4/1989  (WO) .
WO 92/18992   10/1992  (WO) .

* cited by examiner

Primary Examiner—Lincoln Donovan
(74) Attorney, Agent, or Firm—John J. Fry

(57) ABSTRACT

A high temperature superconductor (HTSC) 5 is magnetized between drive coils 1,2 forming poles of a magnet connected by an iron yoke 9 by relative movement of a vacuum insulated cryostat 4 containing the HTSC and the magnetizing magnet, in order to magnetize a large area of HTSC using a magnet with a small region 3 of magnetizing flux. Alternatively, the HTSC 5 may be contained in an evacuated region of a cryostat containing the magnetizing magnet. An interconnecting chamber allows the HTSC to be moved between an operative region and a magnetizing region without substantial loss of vacuum.

20 Claims, 3 Drawing Sheets

MAGNETIZING MAGNET

BACKGROUND

This invention relates to magnetizing magnets for use with high temperature superconductors (HTSCs).

HTSCs have a critical (transition) temperature, above which they cease to be superconducting, of less than 100° K. and in many cases below the 77° K. boiling point of nitrogen. Some of these HTSCs are magnetizable and behave like permanent magnets below their critical temperatures. One such is melt-processed single crystal yttrium barium copper oxide, Y—Ba—Cu—O (M-P YBCO), typically having the composition (Y $Ba_2CU_3O_{7-x}$).

Use of M-P YBCO involves a number of problems, including the need to be able to generate the fields needed to magnetize it, and the fact that if, for any reason, the material warms up above its critical temperature it will lose all its magnetization. Then, after re-cooling, it requires further magnetization.

The problem of magnetizing the material is that it must be cooled to below 90° K. (the critical temperature of YBCO) and ideally to below 50° K. (as the flux it traps increases markedly as its temperature is reduced). In practice, a block of material needs to be held inside a vacuum container as primary insulation supported on insulating struts with sufficiently low conductivity to minimize heat conduction to the block, but with a necessary material strength to support the forces its enormous potential magnetization could cause to act on it in the presence of an external magnetic field. A means of keeping the material cold, typically using a good thermal conductor in contact with it which can be cooled through an appropriate low thermal resistance connection to the cold head of a refrigerator, is also needed and requires insulation. Such insulation and support tends to involve several centimeters of space (perhaps 2 to 4 centimeters) around the block of material.

Such a magnet could be used to provide, or to supplement, the main magnetic field of a magnetic resonance imaging magnet. While such a magnet would have advantages in terms of the strength of field generated in terms of its size, it would suffer the disadvantage of the problems which would be caused if its refrigerator failed and it warmed up to above its critical temperature, which could take from a few minutes to a couple of hours.

In particular, it would be desirable for the magnetizing magnet needed to re-magnetize it to be transportable so that it could be brought to the relevant imaging apparatus, perhaps one of several in a hospital, in order to allow re-magnetization to take place.

However, the bulk of the HTSC in its cryostat, allied to the potentially very high fields needed (up to 8 to 10 Tesla (T)), means that the magnetizing magnet would have to be very large and have a potentially significant fields spread. This would make it very difficult to locate and could make it impracticable to be transportable for re-magnetization of devices in-situ.

SUMMARY

According to one aspect of the present invention, a magnet for magnetizing a high temperature superconductor is provided. The magnet includes a pair of poles for generating a magnetizing flux having a cross sectional area and means for imparting relative movement between the area of magnetizing flux and a high temperature superconductor of area greater than the cross-sectional area of the magnetizing flux.

According to a more limited aspect, the magnet includes a cryostat having an evacuated region for containing the high temperature superconductor. The cryostat is moveable between the poles of the magnetizing magnet.

According to another more limited aspect of the present invention, the magnet includes a cryostat having an evacuated region. The poles are disposed within the cryostat. According to yet another more limited aspect, the magnet includes means for cooling successive portions of the high temperature superconductor as the portions pass through the area of magnetizing flux.

According to yet another more limited aspect, the magnet includes a thermally conducting plate and a thermal conductor for thermal contact with a refrigerator. The high temperature superconductor is mounted on the plate, and the conductor is in thermal contact with the plate. According to more limited aspect, a thermocouple is in thermal communication with the high temperature superconductor.

According to another aspect of the present invention, a cryogenic magnetizing apparatus for use with a high temperature superconductor contained in a first evacuated region of a first cryostat is provided. The apparatus includes a second cryostat having a second evacuated region for receiving the high temperature superconductor for magnetization, magnetic field generating windings for generating a magnetizing magnetic field in the second evacuated region, and means for interconnecting the first and second cryostats such that the high temperature superconductor may be transferred between the first and second evacuated regions without substantial loss of vacuum.

According to a more limited aspect, the apparatus includes means for cooling the high temperature superconductor below its critical temperature in the presence of the magnetizing magnetic field. According to another more limited aspect, The apparatus includes means for imparting relative movement between the high temperature superconductor and the magnetizing magnetic field. According to a yet more limited aspect, successive portions of the high temperature superconductor are cooled as they pass through the magnetizing magnetic field.

According to yet another more limited aspect of the present invention, the interconnecting means is an evacuable chamber. The apparatus also includes closures for the first and second evacuated regions. The first and second closures are removable when the chamber has been evacuated.

The high temperature superconductor may include a plurality of high temperature superconductor portions. A carrier having non-magnetizable guides supports the superconductor.

One advantage of an embodiment of the present invention is that a magnetizing magnet with a relatively small field may be used to magnetize a relatively large HTSC.

Yet another advantage of an embodiment of the present invention is that the magnetizing magnet may accommodate the HTSC without its own cryostat during magnetization, enabling the magnetizing magnet to be made smaller and easier to be transported, while allowing return of the HTSC to its own cryostat after magnetization without substantial loss of vacuum.

Still other features and benefits of the present invention will be appreciated by those skilled in the art upon reading and understanding the attached description.

DRAWINGS

Ways of carrying out the invention will now be described in detail, by way of example, with reference to the accompanying drawings, in which.

DESCRIPTION

Figure 1:
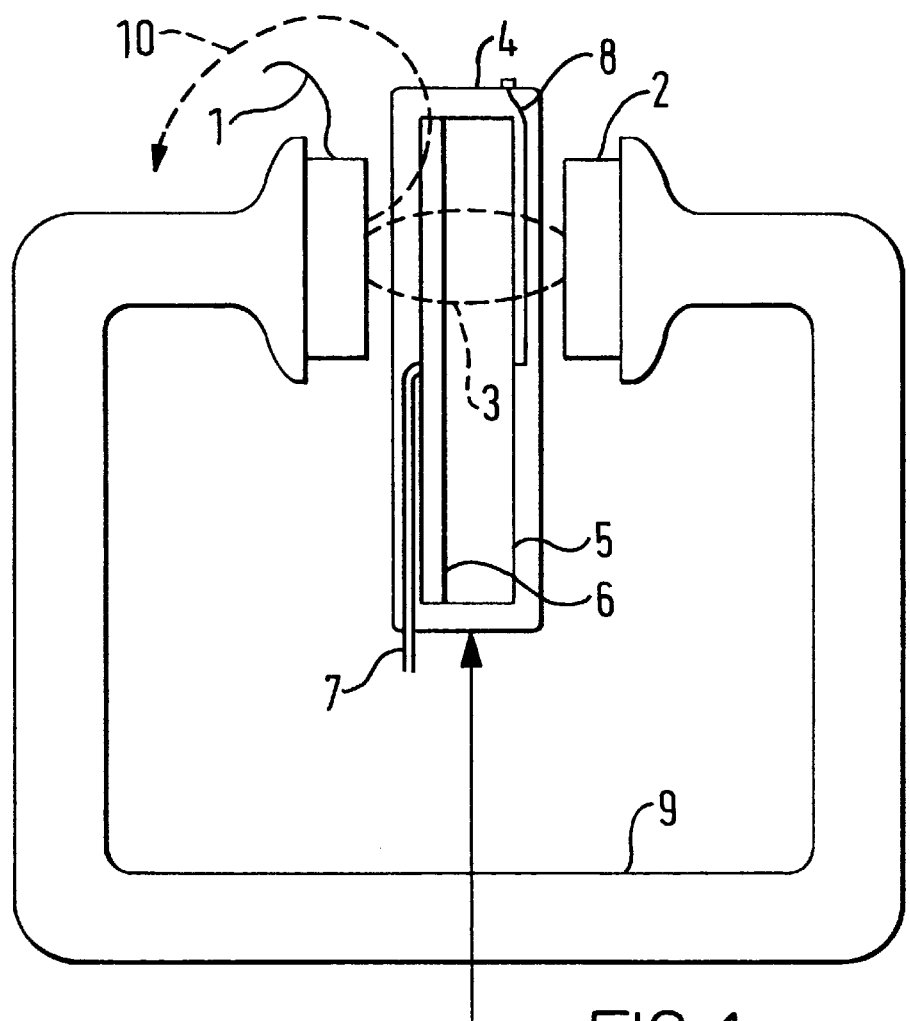
FIG. 1 is a front view, partly in section, of a first magnetizing magnet.

Referring to FIG. 1, the first magnetizing magnet comprises a pair of drive coils 1, 2 forming poles for generating a magnetizing flux 3 indicated schematically by the dotted region. Between the poles, a flat thin cryostat 4 is arranged containing an HTSC 5 mounted on a carrier plate 6.

The cryostat 4 is evacuated so as to insulate the HTSC 5, which is cooled by virtue of its carrier plate 6 which is thermally conducting, and via a conductor 7 which can be solid or multi-filamentary, which is in contact at its other end with the cold finger of a refrigerator, which may be of the Sterling cycle or the Gifford-McMahon type. The carrier plate 6 may be of ceramic material, and the conductor 7 may be of copper. Thermocouples 8 are installed to monitor at least the central and edge temperatures of the HTSC 5.

The two coils 1, 2 are connected at their rear ends by an iron yoke 9. The purpose of this is to route a useful fraction of the flux generated by the coils around the outside of the HTSC 5, even though it is likely to be significantly saturated particularly near the coils. The coils are wound in the same sense, and the main magnetizing flux 3 is shown generally in the dotted region. There will be some leakage flux passing through regions of the HTSC 5 away from that near the axis of the coil (a typical line of force of such leakage flux being denoted 10), but the fields that these other places will be much less than centrally.

In order to magnetize the whole of the HTSC 5 with the relatively small area of magnetizing flux, a drive mechanism (not shown) is provided for imparting movement of the cryostat 4 relative to the pole pieces of the magnetizing magnet. The movement is both in the direction of the arrow, and at right angles to the direction of the arrow (into the plane of the drawing), in order that all areas of the HTSC 5 can be energized by the magnetizing flux 3.

The HTSC block 5 can be magnetized in one of two ways, either by applying a field to the material which is held below its critical temperature, or to maintain a field and cool the HTSC 5 through its critical temperature. In the former case, the magnetization achieved is only about two thirds of the applied field, whereas in the latter case the magnetization achieved is that determined by the field.

Both modes can be accomplished by the arrangement shown in FIG. 1. In both cases, the HTSC 5 in its cryostat 4 must be moved relative to the magnetizing magnet. Generally it is likely to be easier to move the cryostat, but there could be circumstances in which the cryostat would remain stationary and the magnetizing magnet would be moved. The movement is required to be in two directions so that the central field between the coils covers the whole of the HTSC 5 at some time or other.

Thus, the block may be kept cold, that is, below the critical temperature of the HTSC 5, and the drive mechanism moves the block so that the central field covers all parts of it at some time or other. Alternatively, the HTSC block 5 starts with its temperature above its critical temperature. It is then cooled slowly, with the temperature coldest, and below its critical temperature, at the center and moving towards the edge. The cryostat 4 is then moved rapidly and continuously, for example, in a spiral path, so that the field covers the whole of the HTSC 5. The aim is for the temperature to fall below the critical temperature at the time the magnetic flux is being applied, and the movement should be sufficiently rapid that the temperature of each incremental area is not allowed to drop more than 1° C. below its critical temperature (preferably not more than 0.2° C. below the critical temperature) while the magnetic flux is being applied. The block may also incorporate heaters so as to control the time when each area passes through the critical temperature. The path of cooling and of the corresponding magnetizing flux need not be from the center outwards but could be from one edge of the block to the opposite edge, the magnetizing flux sweeping out a zig-zag path on the HTSC 5.

Figure 2:
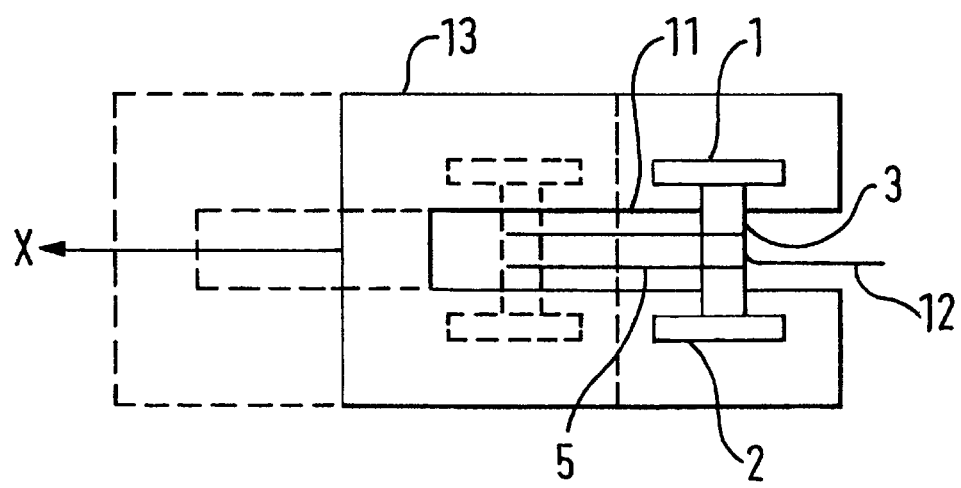
FIG. 2 is a sectional view, partly schematic, of a second magnetizing magnet.

Referring to FIG. 2, the second magnetizing magnet differs from the first in that there is no iron yoke 9 connecting the drive coils 1, 2, and these drive coils are contained within a cryostat 13. The HTSC block 5, which is mounted on a carrier (not shown) does not have its own cryostat 4, and the HTSC 5 is contained in an evacuated region 11 of the cryostat 13. In the drawing, the region at the right hand end of the enclosure 11 is shown as open, but in reality it would be sealed off.

In this embodiment, the magnetizing magnet is moved, in the direction of the arrow X, and at right angles to the direction of the arrow (into the plane of the drawing), and the HTSC 5 remains stationary, but this position could be reversed if desired. A variable heat shield 12 is applied to one edge of the block and cools each part of the block in turn through its critical temperature when it is in the region of the narrow beam of magnetizing flux 3, while the relative movement takes place. The dotted outline shows the extreme position of the magnet when its magnetizing flux 3 has traversed the entire length of the HTSC block 5. As with the first magnetizing magnet, the magnetizing flux may be applied as the area of the HTSC block 5 swept is passing through its critical temperature, or the whole block 5 may be held below its critical temperature and the flux may sweep out the entire area. Again, as with the first embodiment, the movement of the magnet is required to be in two directions to cover the area of the block. Temperature monitors are implanted in the block along with heaters.

In practice, the HTSC 5 in its own evacuated cryostat may be transferred into the evacuated magnetizing magnet cryostat 13 via an evacuable interconnecting region as will now be described in relation to FIGS. 3–6.

Figure 3:
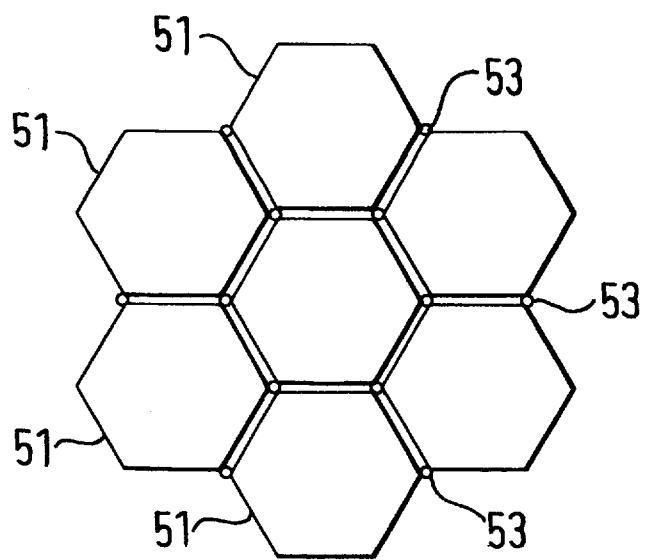
FIG. 3 is a plan view of the HTSC magnet.
Figure 6:
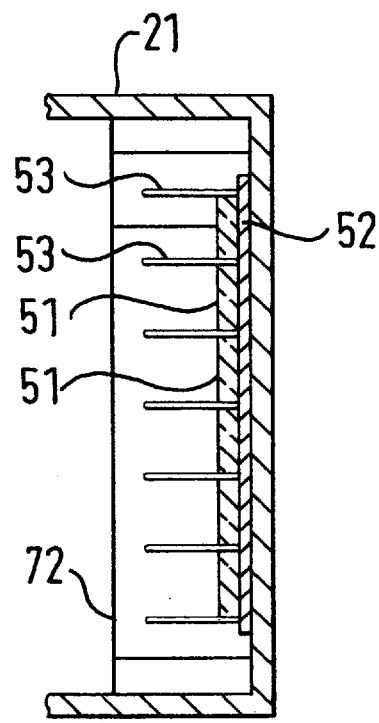
FIG. 6 is an axial cross-sectional view, partly schematic, of part of a cryostat for an HTSC made up of smaller areas. Like reference numerals have been given to like parts throughout the figures.
Figure 4:
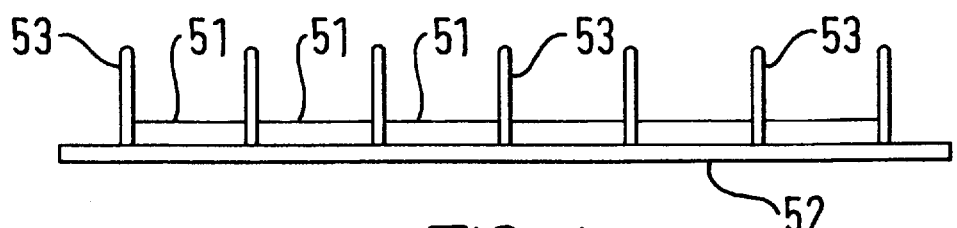
FIG. 4 is a side elevational view of the HTSC magnet.

Referring to FIGS. 3 and 4, the HTSC is melt-processed YBCO, which is a single crystal which at low temperatures can trap very substantial quantities of magnetic flux making it behave as one of the most powerful forms of permanent magnet yet described. Melt-processed YBCO is, ideally, a single crystal, the typical diameters of which are 4 to 5 centimeters for commercially produced YBCO. Since many applications require larger components than this, multiple crystals may be needed, but in order to avoid the loss of too much flux around their sides, these need to be close packed. In FIGS. 3 and 4, the crystals have been cut to form hexagons. The hexagonal areas (tiles) 51 are guided onto a carrier plate 52 by means of non-magnetic guides 53, which may be e.g. of stainless steel or other non-ferromagnetic materials. The cross-section of the guides is chosen to be as small as practicable, compatible with the forces that they are there to control, so as to avoid flux leakage through them. The guides allow the crystals to be picked up for magnetization and then guided back into the position when magnetized. The force on a magnetized component being re-inserted into a largely already-magnetized array are substantial.

The tiles may be contained in thin stainless steel cans, or secured to individual stainless steel carrier plates.

The tiles may be picked up using hooks on their surfaces, or on their rims, or on the surfaces or rims of stainless steel cans or individual carrier plates (if provided).

Although FIGS. 3 and 4 show each crystal as being separately guided, obviously they could be arranged so that there is one set of guides for a group of them.

Figure 5:
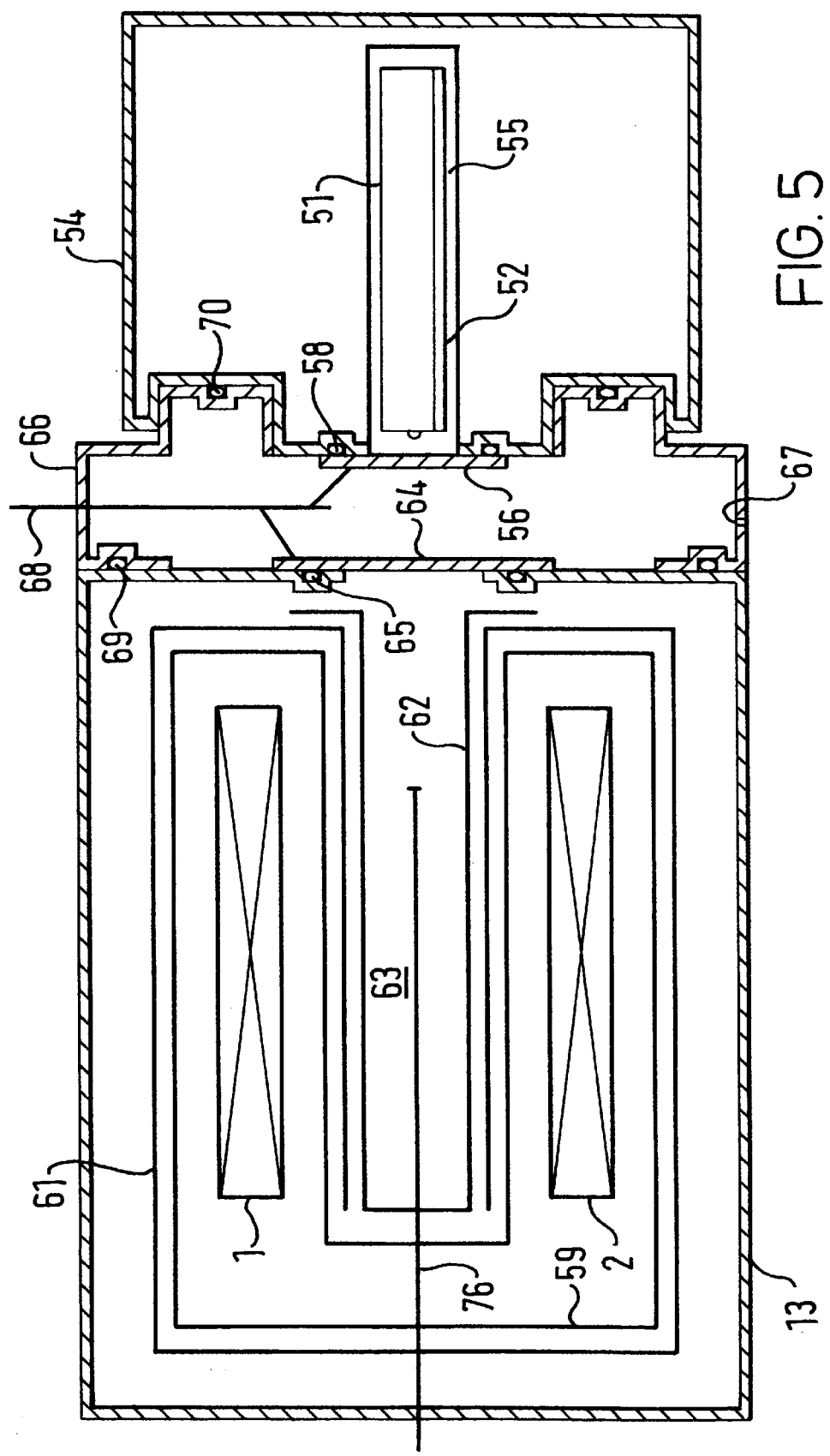
FIG. 5 is an axial cross-sectional view, partly schematic, of a first magnetizing magnet interconnected with an HTSC cryostat.

Referring to FIG. 5, the magnetizing unit is suitable for magnetizing one unit of the HTSC magnet of FIGS. 3 and 4, or a small individual HTSC magnet.

The magnet 51 in contained in a cryostat 54 in an evacuated region 55 closed by a door 56 sealed by seals 58. A refrigerator (not shown) is provided for maintaining the HTSC below its critical temperature. If used in an MRI apparatus, the magnet would be transferred to its working location in the MRI apparatus from the cryostat 54 and vice versa.

The magnetizing magnet consists of a set of field coils 1,2 which are constructed of low temperature superconductors, for example niobium titanium (niobium tin could also be used but is more difficult to work with). If desired, the low temperature superconducting coils could be surrounded by active shielding superconducting coils (not shown) to minimize the stray field from the magnetizing magnet. If desired, the field and shielding coils could also be HTSC superconductors.

These coils are contained in a helium container 59 which is contained within a cryostat 13, with a heat shield 61 interposed between the two.

A heat shield 62 is contained in an evacuated region 63 of the magnetizing magnet, and is connected to the cold finger of a cryogenic cooler (not shown), which may be of the Sterling cycle or the Gifford-McMahon type. The evacuated region 63 is closed by a door 64 sealed by seals 65.

An interconnection chamber 66 is provided to which both the magnetizing magnet and the HTSC cryostat are attached when it is desired to magnetize the HTSC. The HTSC may be used as part of an MRI apparatus, and it may be being magnetized for the first time. Alternatively, the HTSC may require re-magnetization, because it has risen above its critical temperature, perhaps because of a failure of a refrigeration system holding the temperature of the HTSC below its critical temperature. The interconnection chamber 16 is sealed against the magnetizing magnet and the HTSC cryostat by means of seals 69, 70, respectively, which, like the seals 58 and 65 could be O-rings.

The interior of the interconnecting chamber 66 is evacuated by means of a line 67 and, when this is done, gate extractor 68 is used to pull the doors 64, 56 aside so that the vacuum spaces 63 and 55 are joined. This is carried out with minimal loss of vacuum.

Collection rod 76, linking with a hook e.g. on the rim of the HTSC 51 is then used to pull the HTSC block on its carrier into the magnet and into contact with the variable heat shield 62. The heat shield in the HTSC cryostat (not shown) is maintained cold pending the return of the HTSC.

The variable heat shield 62 is used to control the HTSC temperature during magnetization. It is connected to a cryogenic refrigerator (not shown).

If desired, the HTSC 51 may be cooled below its critical temperature in cryostat 54 or in enclosure 63, and then the magnetic field from field coils 1,2 may be applied, which imparts a magnetization at right angles to the plane of the HTSC 51.

However, it is preferred that the variable heat shield 62 is used to cool the HTSC 51 while a field from the field coils 1,2 is held desirably constant, since a lower field is needed to produce a given level of magnetization in HTSC in this way.

On completion of the magnetization, the process is reversed and the HTSC is returned to its own cryostat which is resealed, after which the interconnecting chamber is allowed to return to atmospheric pressure, and the HTSC cryostat is detached from the interconnecting chamber 66.

While the magnetizing magnet of FIG. 5 is suitable for small HTSCs 51, in the case of a larger area such as shown in FIG. 3, a larger cryostat is needed for the magnet made of smaller areas (FIG. 6), and the plane of the carrier plate 52 is now arranged normal to the direction of retraction of the collection rod 76. A transport mechanism 72 is used to lift each tile of the magnet of FIG. 3 in turn to centralize it in register with the door 64 of the magnetizing magnet and to flip it on its side to assume the position of the HTSC 51 in FIG. 5.

Referring to the magnetizing magnet of FIG. 2, it should be noted that instead of the magnetizing magnet moving, clearly this can remain stationary and the HTSC 5 could be moved. In FIG. 2, the dotted outline of the magnetizing magnet represents its extreme position after it has been moved.

The HTSC may be yttrium barium copper oxide, Y—Ba—Cu—O (M-P YBCO), typically having the composition Y $Ba_2Cu_3O_{7-X}$. Alternatively, other high temperature superconductors may be used for example the material known as BSCCO ($Bi_2Sr_2Ca_1Cu_2O_8$ or $Bi_2Sr_2Ca_2Cu_3O_{10}$).

The invention has been described in relation to its preferred embodiments. Obviously, modifications and alterations will occur to others upon reading and understanding the preceding description. It is intended that the invention be construed as including all such modifications and alterations insofar as the come within the scope of the appended claims or the equivalents thereof.

What is claimed is:

1. A magnet for magnetizing a high temperature superconductor having a cross-sectional area, the magnet comprising:

a pair of poles for generating a magnetizing flux having a cross-sectional area in a cross-sectional region, the cross-sectional area of the magnetizing flux in the cross-sectional region being less than the cross-sectional area of the high temperature superconductor; and means for imparting relative movement between the high temperature superconductor and the cross-sectional region of the magnetizing flux, wherein in operation successive portions of a high temperature superconductor maintained at a temperature near its critical temperature and having a cross-sectional area greater than that of the magnetizing flux are magnetized as the portions pass through the area of magnetizing flux.

2. The magnet of claim 1 including a cryostat having an evacuated region for containing the high temperature superconductor, wherein said cryostat is moveable between the poles of the magnetizing magnet.

3. The magnet of claim 1 including a cryostat having an evacuated region, wherein the poles are disposed within the cryostat.

4. The magnet of claim 1 including means for cooling the successive portions of the high temperature superconductor as the portions pass through the area of magnetizing flux.

5. The magnet of claim 1 including a thermally conducting plate and a thermal conductor for thermal contact with a refrigerator, wherein the high temperature superconductor is mounted on the plate and wherein the conductor is in thermal contact with the plate.

6. The magnet of claim 5 including a thermocouple in thermal communication with the high temperature superconductor.

7. The magnet of claim 1 wherein the poles include drive coils.

8. The magnet of claim 7 including a yoke connecting the poles.

9. A method of magnetizing a high temperature superconductor, the method comprising:

subjecting a region of the high temperature superconductor to a magnetizing flux having a cross sectional area, the high temperature superconductor having an area greater than the cross sectional area of the magnetizing flux;

repeating the step of subjecting for a plurality of regions of the high temperature superconductor.

10. The method of claim 9 wherein the high temperature superconductor is disposed in an first evacuated region and the region of magnetic flux is disposed in a second evacuated region, the method including:

establishing a third evacuated region between the first and second evacuated regions; and moving the high temperature superconductor through the third evacuated region to the second evacuated region.

11. The method of claim 10 wherein a plurality of high temperature superconductors are disposed in the first evacuated region and including repeating the steps of subjecting, repeating the step of subjecting, and moving for each of a plurality of the high temperature superconductors.

12. The method of claim 9 wherein the high temperature superconductor is disposed in a cryostat and the step of subjecting includes imparting relative motion between the cryostat and the magnetic flux.

13. A method of magnetizing a high temperature superconductor having a cross-sectional area, the method comprising:

using a pair of poles to generate a magnetizing flux having a cross-sectional area in a cross sectional-region, the cross-sectional area of the magnetizing flux being smaller than the cross-sectional area of the high temperature superconductor; and imparting relative movement between the high temperature superconductor and the cross-sectional region of the magnetizing flux, wherein in operation successive portions of a high temperature superconductor maintained at a temperature near its critical temperature and having a cross-sectional area greater than that of the magnetizing flux are magnetized as the portions pass through the area of magnetizing flux.

14. A method according to claim 13 including containing the high temperature superconductor in a cryostat having an evacuated region and moving the cryostat between the poles of the magnetizing magnet.

15. A method according to claim 13 including disposing the poles within a cryostat having an evacuated region.

16. A method according to claim 13 including cooling the successive portions of the high temperature superconductor as the portions pass through the area of magnetizing flux.

17. A method according to claim 13 including using a thermally conducting plate and a thermal conductor for thermal contact with a refrigerator, mounting the high temperature superconductor on the thermally conducting plate; and thermally contacting the conductor with the plate.

18. A method according to claim 17 including using a thermocouple in thermal communication with the high temperature superconductor.

19. A method according to claim 13 including using drive coils at the poles.

20. A method according to claim 19 including using a yoke to connect the poles.

* * * * *